United States Patent
Nam et al.

(10) Patent No.: US 9,230,779 B2
(45) Date of Patent: Jan. 5, 2016

(54) METHODS AND APPARATUS FOR CORRECTING FOR NON-UNIFORMITY IN A PLASMA PROCESSING SYSTEM

(75) Inventors: Sang Ki Nam, Contra Costa, CA (US); Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 842 days.

(21) Appl. No.: 13/423,279

(22) Filed: Mar. 19, 2012

(65) Prior Publication Data

US 2013/0240145 A1 Sep. 19, 2013

(51) Int. Cl.
| | |
|---|---|
| *H01J 37/32* | (2006.01) |
| *C23C 16/44* | (2006.01) |
| *C23C 16/455* | (2006.01) |
| *C23C 16/509* | (2006.01) |
| *A23G 3/26* | (2006.01) |
| *B05B 12/00* | (2006.01) |
| *B05B 13/04* | (2006.01) |
| *H01L 21/67* | (2006.01) |

(52) U.S. Cl.
CPC ....... *H01J 37/32183* (2013.01); *C23C 16/4401* (2013.01); *C23C 16/45565* (2013.01); *C23C 16/509* (2013.01); *C23C 16/5096* (2013.01); *A23G 3/26* (2013.01); *B05B 12/00* (2013.01); *B05B 13/0431* (2013.01); *B05B 13/0452* (2013.01); *H01J 37/321* (2013.01); *H01J 37/32009* (2013.01); *H01J 37/3244* (2013.01); *H01J 37/32082* (2013.01); *H01J 37/3299* (2013.01); *H01J 37/32174* (2013.01); *H01J 37/32532* (2013.01); *H01J 37/32623* (2013.01); *H01J 37/32935* (2013.01); *H01J 37/32972* (2013.01); *H01L 21/6715* (2013.01); *H01L 21/67069* (2013.01); *H01L 21/67253* (2013.01)

(58) Field of Classification Search
USPC .............. 118/723 E, 723 R, 695; 156/345.24, 156/345.28, 345.43
See application file for complete search history.

(56) References Cited

U.S. PATENT DOCUMENTS

| | | | | |
|---|---|---|---|---|
| 5,688,357 A | * | 11/1997 | Hanawa | 156/345.28 |
| 6,221,221 B1 | * | 4/2001 | Al-Shaikh et al. | 204/298.02 |
| 6,265,831 B1 | * | 7/2001 | Howald et al. | 315/111.21 |
| 6,507,155 B1 | * | 1/2003 | Barnes et al. | 315/111.51 |
| 7,764,140 B2 | * | 7/2010 | Nagarkatti et al. | 333/17.3 |
| 8,911,588 B2 | * | 12/2014 | Nam et al. | 156/345.28 |
| 2004/0250955 A1 | * | 12/2004 | Blonigan et al. | 156/345.51 |
| 2005/0061442 A1 | * | 3/2005 | Higashiura | 156/345.44 |
| 2005/0066902 A1 | * | 3/2005 | Fink | 118/729 |
| 2006/0060302 A1 | * | 3/2006 | White et al. | 156/345.28 |
| 2008/0110860 A1 | * | 5/2008 | Miller et al. | 216/71 |
| 2008/0187682 A1 | * | 8/2008 | Park et al. | 427/569 |
| 2009/0200269 A1 | * | 8/2009 | Kadkhodayan et al. | 216/71 |
| 2009/0242135 A1 | * | 10/2009 | Koshimizu et al. | 156/345.48 |
| 2010/0089319 A1 | * | 4/2010 | Sorensen et al. | 118/723 E |

(Continued)

*Primary Examiner* — Rudy Zervigon
(74) *Attorney, Agent, or Firm* — Martine Penilla Group, LLC

(57) ABSTRACT

A plasma processing system having a plasma processing chamber comprising at least one of a chamber wall and a chamber liner is disclosed. The plasma processing system includes a plurality of ground straps disposed around a circumference of a chamber surface, the chamber surface being one of the chamber walls and the chamber liner of the plasma processing chamber. The plasma processing system further includes at least a first impedance device coupled to at least a first ground strap of the plurality of ground straps, wherein a second ground strap of the plurality of ground straps is not provided with a second impedance device having the same impedance value as the first impedance device.

13 Claims, 10 Drawing Sheets

(56) References Cited

U.S. PATENT DOCUMENTS

| | | | |
|---|---|---|---|
| 2010/0136261 A1* | 6/2010 | Tso et al. | 427/569 |
| 2010/0154709 A1* | 6/2010 | Fischer et al. | 118/723.1 |
| 2010/0154996 A1* | 6/2010 | Hudson et al. | 156/345.35 |
| 2010/0193128 A1* | 8/2010 | Koumura et al. | 156/345.28 |
| 2010/0288197 A1* | 11/2010 | Choi et al. | 118/723 R |
| 2013/0240145 A1* | 9/2013 | Nam et al. | 156/345.28 |
| 2013/0240147 A1* | 9/2013 | Nam et al. | 156/345.46 |
| 2013/0240482 A1* | 9/2013 | Nam et al. | 216/59 |
| 2013/0277333 A1* | 10/2013 | Misra et al. | 216/61 |
| 2014/0034239 A1* | 2/2014 | Yang et al. | 156/345.28 |
| 2014/0053984 A1* | 2/2014 | Doh et al. | 156/345.43 |
| 2014/0113453 A1* | 4/2014 | Shih et al. | 438/710 |
| 2014/0315392 A1* | 10/2014 | Xu et al. | 438/710 |

\* cited by examiner

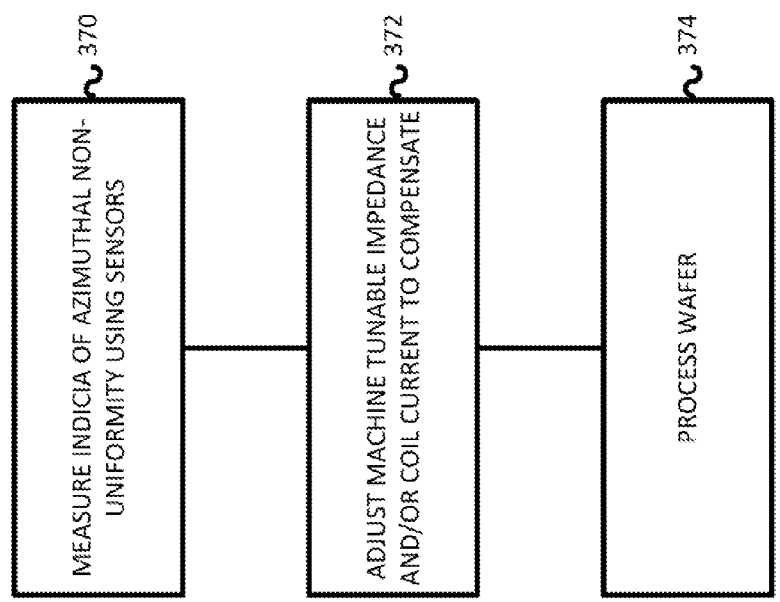

METHODS AND APPARATUS FOR CORRECTING FOR NON-UNIFORMITY IN A PLASMA PROCESSING SYSTEM

BACKGROUND OF THE INVENTION

Plasma has long been employed to process substrates to form electronic devices. For example, plasma enhanced etching has long been employed to process semiconductor wafers into dies in the manufacture of integrated circuits or to process flat panels into flat panel displays for devices such as portable mobile devices, flat screen TVs, computer displays, and the like.

To facilitate discussion, FIG. 1 shows a typical capacitively coupled plasma processing system having an upper electrode 102, a lower electrode 104 on which a wafer 106 may be disposed for processing. Lower electrode 104 is typically disposed inside of the plasma chamber of which chamber wall 108 is shown. The region between upper electrode 102 and lower electrode 104 above wafer 106 is known as a plasma generating region denoted by reference number 110 in the example of FIG. 1. There is typically a plurality of confinement rings 112, which are substantially concentric rings disposed around and above lower electrode 104 to define and confine the plasma for processing wafer 106. These components are conventional and are not further elaborated here.

To process wafer 106, a process gas is introduced into plasma generating region 110, and RF energy is supplied to one or more of upper electrode 102 and lower electrode 104 in order to facilitate the ignition and sustenance of plasma in plasma generating region 110 for processing wafer 106. In the example of FIG. 1, a powered lower electrode and a grounded upper electrode are employed as an example set up to generate the plasma although this set up is not a requirement and both electrodes may be provided with a plurality of RF signals, for example. RF energy is provided to the lower electrode 104 from RF power supply 120 via an RF conductor 122, which is typically a conductive rod. The RF delivery path follows the direction of arrows 134A and 134B in the cutaway FIG. 1 to allow the RF energy to couple with the plasma in plasma generating region 110. RF current returns to ground following the direction of arrows 140 and 142 in the example of FIG. 1. Again, these mechanisms are known and are conventional in the field of plasma processing and are well known to those skilled in the art.

In the ideal situation, the RF delivery current (delineated by arrows 134A and 134B) and the ground RF return current (delineated by arrows 140 and 142) are symmetric in the azimuthal direction around the chamber. In other words, given a reference orientation on the wafer surface, the ideal situation would see the RF delivery and RF return current being symmetric at any angle theta from a reference radius on the wafer surface. However, practical limitations due to chamber construction and other processing realities may introduce non-symmetry into the chamber, which influences the azimuthal uniformity of processing results on wafer 106.

To elaborate, when the chamber components are not symmetric around the center of the chamber (as viewed from the top of the chamber) for example, the non-symmetry of chamber components influences the RF flux lines, the pressure, plasma density, RF delivery current, or RF ground return current such that the azimuthal non-uniformity of the process may result in non-uniform process results on the processed wafer.

FIG. 2A depicts various factors affecting the symmetry of components within the chamber and/or affecting the wafer symmetry relative to the chamber center, which may in turn affect the azimuthal uniformity of the process results on the wafer surface. With respect to FIG. 2A, there is shown a top view of chamber 200. There is shown chamber wall 202, within which there is disposed a lower electrode 204. A wafer 206 is shown disposed slightly off-center relative to lower electrode 204. As such, the processing center is offset from the center of the substrate, introducing azimuthal non-uniformity of processing results on substrate 206.

As another example, lower electrode 204 may be offset from the center of chamber 200, which may introduce non-symmetry and azimuthal non-uniformity of process results even if wafer 206 is centered correctly on lower electrode 204. Since the lower electrode 204 is charged relative to the grounded chamber wall 202, the different distances between the edge of the lower electrode 204 and chamber wall 202 around periphery of lower electrode 204 introduces variations in the parasitic coupling between the charged lower electrode and the grounded chamber wall, which in turns affect the plasma density at different locations on wafer 206, thereby introducing azimuthal non-uniformity.

Further, the RF delivery conductor (122 of FIG. 1) may be offset relative to the chamber enclosure, likewise introducing variations in the parasitic coupling between the RF conductor and the grounded chamber wall, thereby affecting the azimuthal uniformity of processing results on the wafer. Still further, the presence of certain mechanical components, such as the cantilever arm 208 that supports lower electrode 204 inside chamber 202, presents an impediment to the exhaust gas flow, which typically flows from the plasma generating region around the edge of the lower electrode to be exhausted toward the bottom of the lower electrode (150 and 152 of FIG. 1). The impediment of the gas flow due to the presence of the cantilever arm would affect the local pressure in the region of the lever arm, thereby affecting the plasma density and in turn affecting the azimuthal uniformity of the process results. Still another factor affecting azimuthal uniformity is the presence of wafer loading port 210, which exists on only one side of chamber 200.

FIG. 2B is a side view of the chamber to illustrate that certain inherent characteristics of the chamber design also introduce non-symmetry and therefore affect the azimuthal uniformity of the process results. For example, one side 252 of the lower electrode 204 may be provided with components such as gas feed, coolant tubes, and the like, which components change the inductance that is presented to any current traveling along the surface of lower electrode 204. Some of these components may not be present on another side 254 of the lower electrode 204. As such, one side of the wafer, which rests on lower electrode 204, may experience a different process result relative to the other side of that wafer, again introducing azimuthal non-uniformity. Further, the fact that the RF feed and/or exhaust current path is a sideway feed in the direction of arrow 220 means that the RF return current has variable-length azimuthal path to return to the power supply depending on whether the RF ground return current is measured on the inside path 222 or the outside path 224

The differences in the lengths of the RF ground return paths introduce different inductances along the ground return paths, which also affect the impedances of the ground return paths. These variations thus create non-symmetry and azimuthal non-uniformity of the process results.

When the process requirements are fairly liberal (for example, when the device sizes are large and/or device density is low) azimuthal non-uniformity is a lesser concern. As device sizes become smaller and device density increases, it is important to maintain uniformity not only in the radial direction (from the center to the edge of the wafer but also in the azimuthal direction at any given angle theta from a reference radius R on the wafer surface. For example, some customers nowadays require that azimuthal non-uniformity be at 1% or even below the 1% threshold. Accordingly, there are desired improved methods and apparatus for managing azimuthal non-uniformity of process results in a plasma processing chamber.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3G shows, in one or more embodiments, the steps for in-situ compensation to address the azimuthal non-uniformity issue.

DETAILED DESCRIPTION OF EMBODIMENTS

Figure 1:
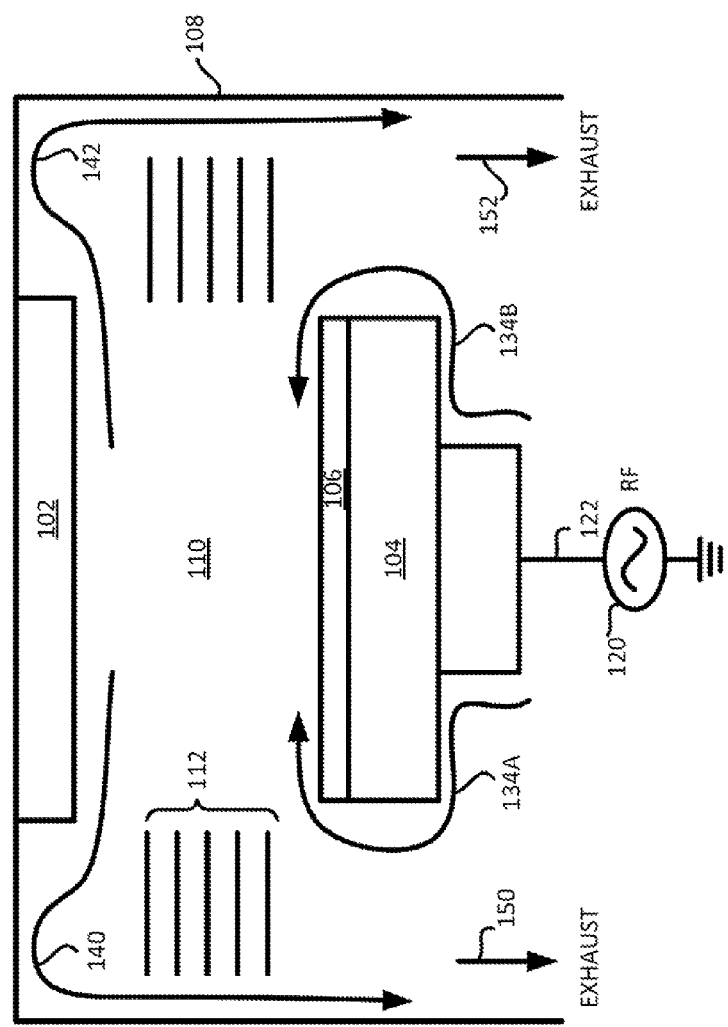
FIG. 1 shows, in accordance with an embodiment of the invention, a typical capacitively coupled plasma processing system having an upper electrode, a lower electrode on which a wafer may be disposed for processing.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the invention, there are provided methods and apparatuses for compensating for the inherent or foreseeable non-symmetry and/or azimuthal non-uniformity in a plasma processing chamber. In one or more embodiments, the impedances of the ground straps that are employed to couple the sidewall or liner of the chamber with the grounded plane are provided with tunable impedances in order to permit an operator or a design engineer to vary the azimuthal impedances in the ground straps to compensate for the inherent or foreseeable non-symmetry due to the presence or use of other components of the chamber.

In one or more embodiments, there are provided methods and apparatus for controlling the impedances of the ground straps affect the impedances that are seen by the RF ground return currents in the azimuthal direction, thereby permitting the operator to tune the impedances and the RF ground return currents azimuthally around the wafer periphery. This compensates for any inherent or foreseeable non-symmetry and/or azimuthal non-uniformity of the process results.

In one or more embodiments, a metallic ring may be disposed under the substrate in order to allow the operator to vary the center of the ring relative to the center of the lower electrode in order to counteract the inherent or foreseeable non-uniformity due to the presence of chamber components and other processing realities.

In one or more embodiments, the ground shield may be modified such that one side presents a shorter path for the ground RF return current than the other side. Alternatively or additionally, the center of the ground shield may be shifted such that the coupling from the ground shield to the charged conductor that is used to carry the RF signal(s) to the lower electrode is intentionally made non-symmetric to compensate for any inherent or foreseeable non-uniformity and/or azimuthal non-uniformity and/or non-symmetry.

The features and advantages of the invention may be better understood with reference to the figures and discussions that follow.

Figure 3A:
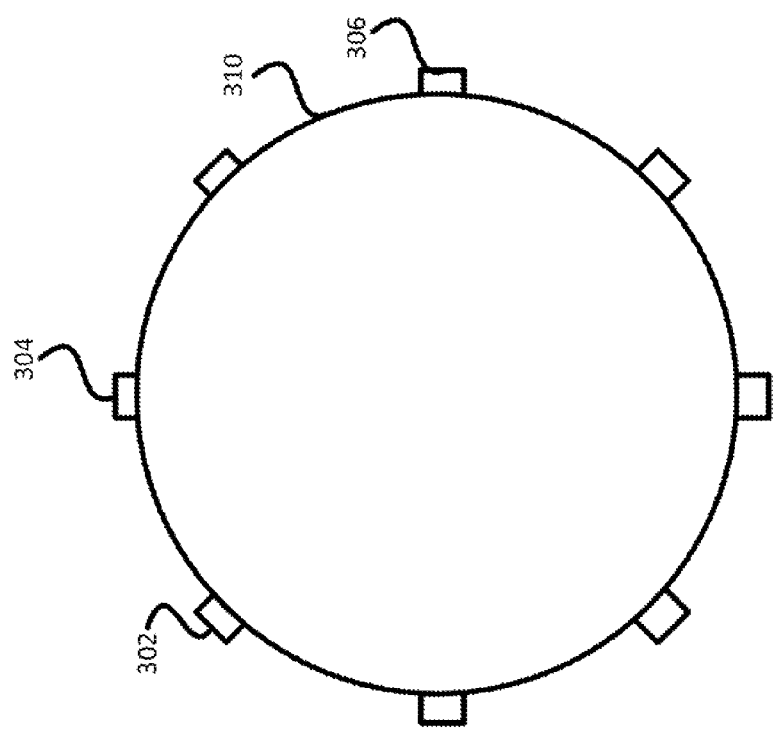
FIG. 3A shows, in accordance with an embodiment of the invention, a plurality of ground straps implemented with impedance devices.

FIG. 3A shows, in accordance with an embodiment of the invention, a simplified top down view of the ground straps arranged around the periphery of the chamber, such as around the circumference of the chamber wall or chamber liner. The ground straps may be employed to provide RF ground return paths from the chamber liner or the chamber wall to the lower electrode for eventual return to ground, for example.

To elaborate, in a typical plasma processing chamber, there are provided ground straps disposed around the circumference of the chamber wall or the chamber liner in an attempt to evenly distribute the RF ground return currents in the azimuthal direction. In an embodiment, a tunable impedance in the form of a variable inductor, a variable capacitor, a variable resistor, or a combination thereof may be provided with one or more of the ground straps. Thus, with reference to FIG. 3A, ground straps 302 and 304 and 306 that are coupled to chamber wall 310 may be provided with tunable impedance devices (such as the aforementioned variable inductors, variable capacitors, variable resistors, or any combination thereof).

During development, the process engineer may assign values or adjust these tunable impedance devices to provide compensation for the inherent or foreseeable non-symmetry or azimuthal non-uniformity. For example, a test wafer may be run and metrology results may be examined to assess the degree and location of azimuthal non-uniformity on the processed test wafer, for example. The tunable impedances of one or more of the ground straps may then be tuned in order to facilitate the presentation of different impedances to different RF ground return currents that traverse the various ground straps.

Figure 3B:
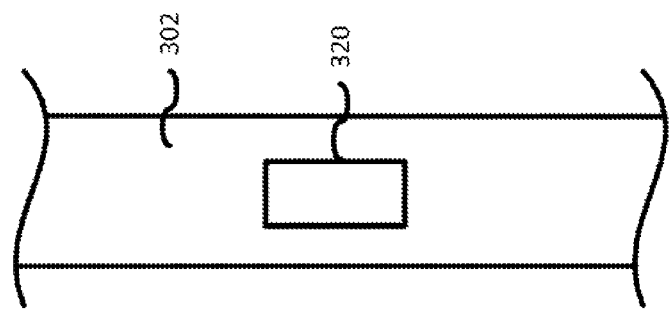
FIGS. 3B-3F show, in accordance with embodiments of the invention, various ways to modify the current in the ground strap to address azimuthal non-uniformity.

In an embodiment, each tunable impedance device may represent a fixed value impedance device (320 of FIG. 3B) that may be coupled with or associated with one or more individual ground straps in order to influence the azimuthal impedance or influence the impedance presented to various RF ground return currents as they traverse the ground straps. In this manner, the RF return currents may be tuned individually in the azimuthal direction to compensate or counter (either partly or wholly) the inherent non-symmetry due to the presence of chamber components or any observed or measured azimuthal non-uniformity (such as may be measured from a test wafer after processing, for example). In this case, at least one of the ground straps would be provided with such an impedance device, and at least another one of the ground straps would not be provided with an impedance device having the same impedance value as the one provided with the at least one of the ground straps. This intentional asymmetry in providing impedances addresses the inherent or foreseeable azithmuthal non-uniformity around the chamber wall or chamber liner.

Figure 3C:
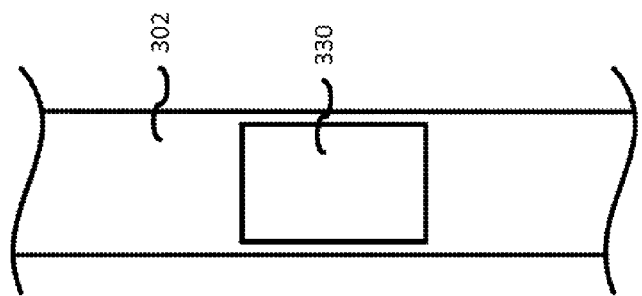

In another embodiment, the ground straps may be provided with tunable impedance devices (330 of FIG. 3C) that can be adjusted manually by a process engineer as part of the chamber qualification process either from modeled or known non-symmetry or azimuthal non-uniformity or from the observed azimuthal non-uniformity that is obtained through metrological results acquired from a test wafer.

For example, the process engineer may manually (or via a computer user interface) adjust the values of the tunable device(s) on one or more of the ground straps in order to account for the non-symmetry that is caused by the cantilever arm used to support the lower electrode. As another example, the process engineer may manually (or via a computer user interface) adjust the values of the tunable impedance(s) for one or more of the ground straps when azimuthal non-uniformity is observed from metrological measurements of the process results on a test wafer.

In this case as well, at least one of the ground straps would be provided with such a tunable impedance device, and at least another one of the ground straps (e.g., the second ground strap for discussion purpose) would not be provided with a tunable impedance device having the same impedance value as the one provided with the at least one of the ground straps. As an example, the second ground strap may be provided with no impedance device or a tunable impedance device having a different impedance value. This intentional asymmetry in providing impedances addresses the inherent or foreseeable azithmuthal non-uniformity around the chamber wall or chamber liner.

Figure 3D:
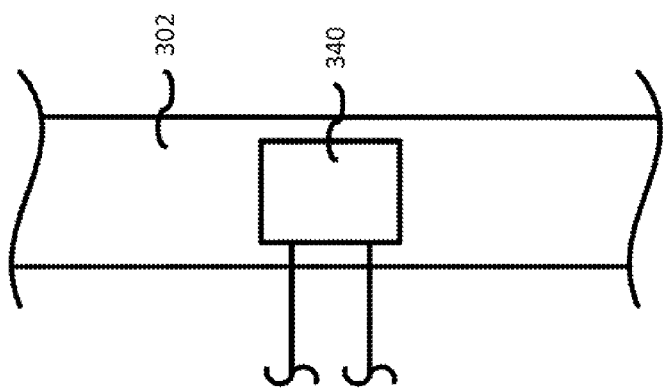

Still further, it is possible to employ sensors to measure the ground return currents on the individual ground straps and, in a dynamic manner, employ machine tunable impedance devices (340 of FIG. 3D) to dynamically tune the impedances to account for wafer-to-wafer variations in the azimuthal non-uniformity or non-symmetry, for example.

Figure 2A:
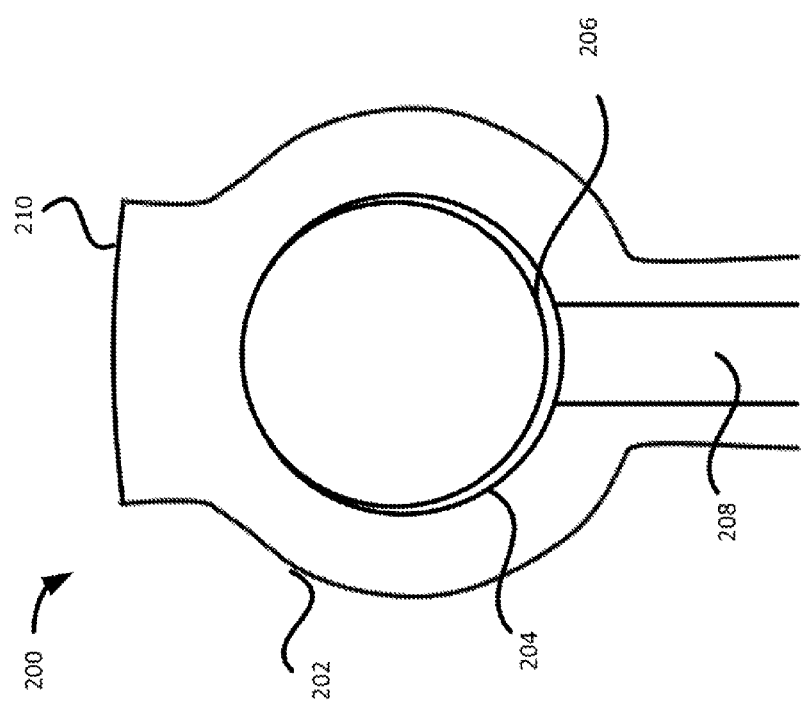
FIG. 2A shows, in accordance with an embodiment of the invention, various factors affecting the symmetry of components within the chamber and/or affecting the wafer symmetry relative to the chamber center, which may in turn affect the azimuthal uniformity of the process results on the wafer surface.
Figure 2B:
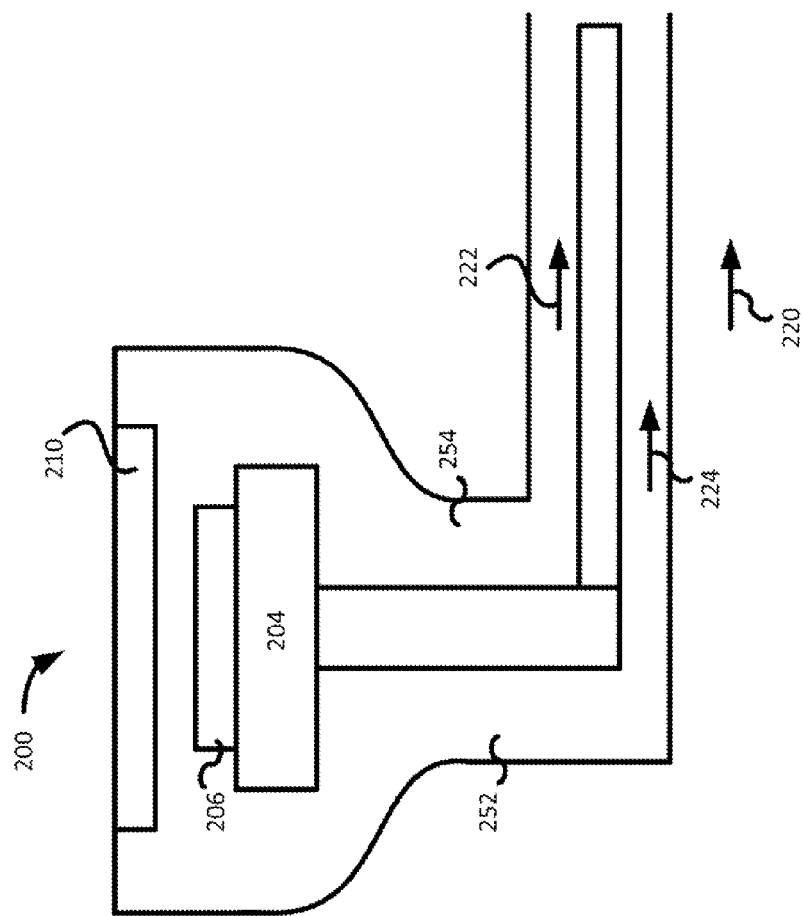
FIG. 2B shows, in accordance with an embodiment of the invention, a side view of the chamber to illustrate that certain inherent characteristics of the chamber design also introduce non-symmetry and therefore affect the azimuthal uniformity of the process results.

For example, if the wafer is positioned slightly off center relative to the lower electrode as in the example of FIG. 2A, measurements may be made in the RF ground return currents through the various straps and automated control equipment may tune the impedances associated with one or more of the ground straps in order to compensate for the fact that sensor measurements have detected non-symmetric conditions and/or the wafer is disposed off-center relative to the lower electrode in order to improve azimuthal uniformity of the process result. The machine tunable impedances may be provided with each of the ground straps or may be provided with only a subset of the ground straps, for example. In one or more embodiments, the tuning of the machine tunable impedances may be performed in-situ on a wafer-by-wafer basis in response to sensor measurements or in response to computations made from sensor measurements. In one or more embodiments, the tuning of the impedances may be performed using the tool control computer or another computer executing computer readable instructions, including computer readable instructions embodied in a computer readable medium such as a computer memory drive. In this case, at least one of the ground straps would be provided with such a machine tunable impedance device, and at least another one of the ground straps would not be provided with a machine tunable impedance device having the same impedance value as the one provided with the at least one of the ground straps. As an example, the second ground strap may be provided with no impedance device or a tunable impedance device having a different impedance value. This intentional asymmetry in providing impedances addresses the inherent or foreseeable azithmuthal non-uniformity around the chamber wall or chamber liner.

Figure 3E:
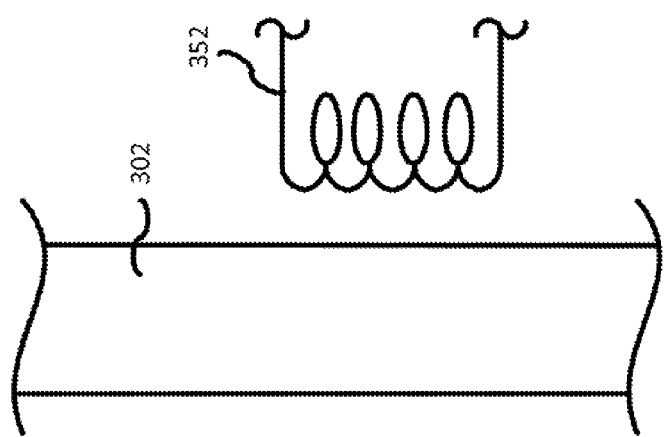
Figure 3F:
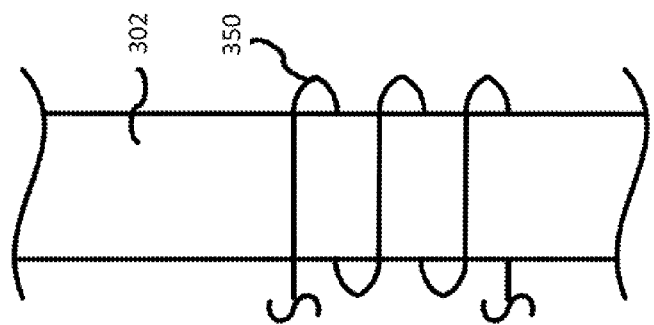

Still further, it is possible to induce a counter current in one or more of the ground straps in order to influence the RF ground return current in one or more of the ground straps. By way of example, a coil (350 of FIG. 3F or 352 of FIG. 3E) may be placed close to one or more of the ground straps or around one or more of the ground straps, and current may be flowed through the coil in order to induce a counter current on the ground strap itself or to induce an additive current in order to compensate for any inherent non-symmetry or azimuthal non-uniformity of the process results. A coil is considered associated with a ground strap if it is placed closer to that ground strap than any other ground strap of the plurality of ground straps.

The coil current(s) may be varied in phase, in intensity, and/or in frequency in order to change the degree by which the RF ground return current is influenced in one or more of the ground straps. This current-oriented compensation may be performed dynamically in-situ to achieve in-situ adjustments of the RF ground return currents in the azimuthal direction. For example, in one or more embodiments, the in-situ adjustment may dynamically, in a real time manner, compensate for the azimuthal non-uniformity and/or for the non-symmetry of the chamber components in a plasma processing chamber.

As another example, the RF ground return currents and/or the compensating coil currents may be ascertained for one or more of the ground straps during chamber qualification. During production, these coil current values may be entered as part of the recipe in order to ensure that any non-symmetry or non-uniform or azimuthal non-uniformity of process results would be compensated for either partly or wholly.

In one or more embodiments, the tuning of the coil currents may be performed in-situ on a wafer-by-wafer basis in response to sensor measurements or in response to computations made from sensor measurements. In one or more embodiments, the tuning of the coil currents may be performed using the tool control computer or another computer executing computer readable instructions, including computer readable instructions embodied in a computer readable medium such as a computer memory drive. In this case, at least one of the ground straps would be provided with such a coil, and at least another one of the ground straps would not be provided with a coil having the same impedance value as the one provided with the at least one of the ground straps. As an example, the second group strap may be provided with no coil or a coil would be adjusted to have a different coil current would be associated with the second ground strap. This intentional asymmetry in providing impedances addresses the inherent or foreseeable azithmuthal non-uniformity around the chamber wall or chamber liner.

FIG. 3G shows, in one or more embodiment, the steps for in-situ compensation to address the aforementioned azimuthal non-uniformity issue. In step 370, indicia of azimuthal non-uniformity are measured using sensors. The sensors maybe a set of PIF (plasma ion flux) probes, optical sensors, V/I probe, optical emission sensors, etc. The sensors may be disposed in one or more locations around the chamber. The indicia may be any measurable parameter that may be employed to ascertain azimuthal non-uniformity, including voltage, current, plasma flux, optical emission, virtual metrology computations, etc. In step 372, the machine tunable impedances and/or the coil currents are adjusted in-situ in response to sensor measurements or in response to computations made from sensor measurements. In step 374, the wafer is processed. The steps of FIG. 3G may be performed wafer-by-wafer or may be performed for a test wafer for every N wafers processed, for example or may be performed periodically on a schedule or may be performed during chamber maintenance or recalibration.

As can be appreciated from the foregoing, embodiments of the invention provide additional control knobs for the process engineer to compensate for non-symmetry of chamber components in a plasma processing chamber and for azimuthal non-uniformity of process results. The compensation devices and techniques are practiced outside of the plasma generating region (such as plasma generating region 110 of FIG. 1), thereby substantially eliminating the introduction of unpredictable or difficult to control side effects to the plasma process. The fact that the tunable impedance devices are disposed away from the plasma processing environment (i.e., in a region where plasma is not present during processing) also improves the lifetime of the tunable impedance devices, reduced the potential contribution of contaminants into the plasma processing environment, and the like.

While this invention has been described in terms of several preferred embodiments, there are alterations, permutations, and equivalents, which fall within the scope of this invention. For example, although the chamber employed in the example is a capacitive chamber, embodiments of the invention work equally well with inductively coupled chambers or chambers using another type of plasma processing technology, such as Electron Cyclotron Resonance, Microwave, etc. Although various examples are provided herein, it is intended that these examples be illustrative and not limiting with respect to the invention. Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing system having a plasma processing chamber, comprising:
   at least one of a chamber wall and a chamber liner;
   a plurality of ground straps disposed around a circumference of a chamber surface, said chamber surface being one of said chamber wall and said chamber liner of said plasma processing chamber;
   a plurality of impedance devices disposed around the circumference of the chamber surface and each is associated with a respective one of the plurality of ground straps; and
   a first impedance device of the plurality of impedance devices is coupled to a first ground strap of said plurality of ground straps, wherein a second impedance device of the plurality of impedance devices is coupled to a second ground strap of said plurality of ground straps;
   wherein the first and second impedance devices are individually tunable to define an intentional non-symmetric impedance at a region around the circumference of the chamber surface to compensate for azimuthal non-uniformities in the plasma processing system;
   wherein each of the plurality of impedance devices is a coil that is wound around each respective one of the plurality of ground straps;
   wherein a coil current value is provided to each coil to induce a current in each of the plurality of ground straps.

2. The plasma processing system of claim 1 wherein said first impedance device and said second impedance device are machine tunable impedance devices configured for being automatically tuned in-situ in response to measurements.

3. The plasma processing system of claim 2 wherein said machine tunable impedance devices are automatically tuned in-situ at least on a wafer-by-wafer basis during production.

4. The plasma processing system of claim 2 wherein said machine tunable impedance devices are automatically tuned in-situ.

5. A plasma processing system having a plasma processing chamber, comprising:
   at least one of a chamber wall and a chamber liner;
   a plurality of ground straps disposed around a circumference of chamber surface, said chamber surface being one of said chamber wall and said chamber liner of said plasma processing chamber;
   a plurality of coils disposed around the circumference of the chamber surface and each is associated with a respective one of the plurality of ground straps; and
   a first coil of the plurality of coils is associated with a first ground strap of said plurality of ground straps, wherein a second coil of the plurality of coils is associated with a second ground strap of said plurality of ground straps;
   wherein a coil current value is provided to each of the plurality of coils to induce a current in each of the plurality of ground straps;
   wherein the coil current value of at least the first and second coils is individually adjustable to define an intentional non-symmetric impedance at a region around the circumference of the chamber surface to compensate for azimuthal non-uniformities in the plasma processing system.

6. The plasma processing system of claim 5 wherein currents in said first coil and said second coil are automatically adjustable to different coil current values in-situ in response to measurements.

7. The plasma processing system of claim 6, wherein said first coil and said second coil are automatically adjusted in-situ to different coil current values at least on a wafer-by-wafer basis during production.

8. The plasma processing system of claim 6 wherein currents in said first coil and said second coil are automatically adjusted in-situ to different coil current values.

9. The plasma processing system of claim 5 wherein said first coil is wound around said first ground strap.

10. The plasma processing system of claim 5 wherein said first coil is positioned closer to said first ground strap than any other ground strap of said plurality of ground straps.

11. The plasma processing system of claim 5 wherein current induced by coil current value in said first coil is additive to current in said first ground strap.

12. The plasma processing system of claim 11 wherein current induced by coil current value in said second coil is counter to current in said second ground strap.

13. The plasma processing system of claim 5 wherein current induced by coil current value in said first coil is counter to current in said first ground strap.

* * * * *